United States Patent
Bruce et al.

[11] Patent Number: 5,981,088
[45] Date of Patent: *Nov. 9, 1999

[54] THERMAL BARRIER COATING SYSTEM

[75] Inventors: Robert W. Bruce, Loveland; David J. Wortman, Hamilton; Rudolfo Viguie, Cincinnati, all of Ohio; David W. Skelly, Burnt Hills, N.Y.

[73] Assignee: General Electric Company, Cincinnati, Ohio

[*] Notice: This patent issued on a continued prosecution application filed under 37 CFR 1.53(d), and is subject to the twenty year patent term provisions of 35 U.S.C. 154(a)(2).

[21] Appl. No.: 08/912,823

[22] Filed: Aug. 18, 1997

[51] Int. Cl.$^6$ .............. B32B 15/04; C23C 14/02; C23C 14/08; F01D 5/28
[52] U.S. Cl. .............. 428/633; 428/472; 416/241 B
[58] Field of Search .............. 428/632, 633, 428/678, 472, 938; 416/241 B

[56] References Cited

U.S. PATENT DOCUMENTS

| | | | |
|---|---|---|---|
| 4,055,705 | 10/1977 | Stecura et al. | 428/633 |
| 4,132,916 | 1/1979 | Hueschen et al. | 313/330 |
| 4,248,940 | 2/1981 | Goward et al. | 428/633 |
| 4,328,285 | 5/1982 | Siemers et al. | 428/633 |
| 4,676,994 | 6/1987 | Demaray | 427/42 |
| 4,861,618 | 8/1989 | Vine et al. | 427/34 |
| 4,880,614 | 11/1989 | Strangman et al. | 428/623 |
| 4,966,820 | 10/1990 | Kojima et al. | 428/622 |
| 4,996,117 | 2/1991 | Chu et al. | 428/633 |
| 5,384,200 | 1/1995 | Giles et al. | 428/552 |
| 5,562,998 | 10/1996 | Strangman | 428/623 |
| 5,603,771 | 2/1997 | Seiberras et al. | 118/723 ME |

FOREIGN PATENT DOCUMENTS

| | | |
|---|---|---|
| 0799904 | 10/1997 | European Pat. Off. . |
| 4302167 | 2/1994 | Germany . |
| 19741961 | 3/1998 | Germany . |

OTHER PUBLICATIONS

Structural properties of Y2O3 stabilized ArO2 films deposited by reactive thermal coevaporation, JP Cheron, F Tcheliebou, and A Boyer 8257 a Journal of Vacuum Science & Technology A 10(5) NY, US, pp. 3207–3209 Sep./Oct. 1992.

Study of Deposition Process and Charaterization of Yttria PSZ Films. hird Euro–Ceramics, V2 pp. 769–774 by E Blachere, P Chainiau and E Beauprez, Sep. 12, 1993.

S. Stecura, "Effects of Compositional Changes on the Performance of a Thermal Barrier Coating System," NASA Technical Memorandum 78976 (1978) (no month).

*Primary Examiner*—John J. Zimmerman
*Attorney, Agent, or Firm*—Andrew C. Hess; David L. Narciso

[57] ABSTRACT

A thermal insulating ceramic layer for use in a thermal barrier coating system on a component designed for use in a hostile thermal environment, such as turbine, combustor and augmentor components of a gas turbine engine. The ceramic layer is formed of zirconia stabilized by yttria and characterized by a columnar grain structure in which a monoclinic phase is present. To attain the monoclinic phase, the ceramic layer contains less than six weight percent yttria, with about two to five weight percent yttria being preferred. The ceramic layer is preferably part of a thermal barrier coating system that includes a substrate and a bond coat adhering the ceramic layer to the substrate. To obtain the desired columnar grain structure, the ceramic layer is deposited by a PVD technique, preferably EBPVD.

20 Claims, 2 Drawing Sheets

THERMAL BARRIER COATING SYSTEM

FIELD OF THE INVENTION

The present invention relates to protective coatings for components exposed to high temperatures, such as components of a gas turbine engine. More particularly, this invention is directed to a thermal barrier coating system that includes a thermal-insulating ceramic layer whose composition and deposition technique significantly enhance the spallation resistance of the coating system.

BACKGROUND OF THE INVENTION

The operating environment within a gas turbine engine is both thermally and chemically hostile. Significant advances in high temperature alloys have been achieved through the formulation of iron, nickel and cobalt-base superalloys, though components formed from such alloys often cannot withstand long service exposures if located in certain sections of a gas turbine engine, such as the turbine, combustor or augmentor. A common solution is to protect the surfaces of such components with an environmental coating system, such as an aluminide coating or a thermal barrier coating system. The latter includes an environmentally-resistant bond coat and a layer of thermal barrier coating (TBC) of ceramic applied over the bond coat. Bond coats are typically formed of an oxidation-resistant alloy such as MCrAlY where M is iron, cobalt and/or nickel, or from a diffusion aluminide or platinum aluminide that forms an oxidation-resistant intermetallic. During high temperature excursions, these bond coats form an oxide layer or scale that chemically bonds the ceramic layer to the bond coat.

Zirconia ($ZrO_2$) that is partially or fully stabilized by yttria ($Y_2O_3$), magnesia (MgO) or other oxides has been employed as the material for the ceramic layer. Yttria-stabilized zirconia (YSZ) is widely used as the ceramic layer for TBCs because it exhibits desirable thermal cycle fatigue properties. In addition, YSZ can be readily deposited by air plasma spraying (APS), low pressure plasma spraying (LPPS), and physical vapor deposition (PVD) techniques such as electron beam physical vapor deposition (EBPVD). Notably, YSZ deposited by EBPVD is characterized by a strain-tolerant columnar grain structure, enabling the substrate to expand and contract without causing damaging stresses that lead to spallation.

As is known in the art, stabilization inhibits zirconia from undergoing a phase transformation (tetragonal to monoclinic) at about 1000° C. that would otherwise result in a detrimental volume expansion. Shown in FIG. 3 is the phase diagram of the zirconia-rich region of the zirconia-yttria system. The phase diagram shows that, at room temperature, a more stable tetragonal phase is obtained and the undesirable monoclinic phase is avoided if zirconia is stabilized by at least about six weight percent yttria. The phase diagram further shows that an yttria content of seventeen weight percent or more ensures a fully stable cubic phase. Testing reported by S. Stecura, "Effects of Compositional Changes on the Performance of a Thermal Barrier Coating System," NASA Technical Memorandum 78976 (1976), showed that plasma sprayed YSZ coatings containing six to eight weight percent yttria were more adherent and resistant to high temperature cycling than YSZ coatings containing greater and lesser amounts of yttria. Conventional practice in the art has been to stabilize zirconia with at least six weight percent yttria, and more typically about six to eight weight percent yttria (6–8% YSZ). Exceptions to this trend have generally been limited to plasma sprayed zirconia that is stabled by a combination of oxides, such as yttria with substantial levels of other oxides as taught in U.S. Pat. Nos. 4,132,916 and 4,996,117.

Though thermal barrier coatings employing zirconia stabilized by 6–8% yttria perform well in gas turbine engine applications, and significant advances have been made with bond coat materials and coating processes that further promote the adhesion, environmental-resistance and durability of YSZ coating systems, still greater improvements are desired for more demanding applications.

SUMMARY OF THE INVENTION

According to the present invention, there is provided a thermal insulating ceramic layer for use in a thermal barrier coating system on a component designed for use in a hostile thermal environment, such as turbine, combustor and augmentor components of a gas turbine engine. The ceramic layer is particularly suited for applications in which temperatures in excess of about 2000° F. (about 1100° C.) are encountered and induce severe thermal cycle fatigue stresses. The material of the ceramic layer is compatible with known metallic bond coats, such as diffusion aluminides and MCrAlY and NiAl coatings, between the surface of the component and the ceramic layer.

In particular, a thermal insulating ceramic layer formed in accordance with this invention is formed of zirconia partially stabilized by yttria and characterized by a columnar grain structure in which a monoclinic phase is present at room temperature. To attain the monoclinic phase, the ceramic layer contains less than six weight percent yttria, preferably about one up to six weight percent yttria. The thermal insulating ceramic layer is preferably part of a thermal barrier coating system that includes a substrate and a bond coat adhering the ceramic layer to the substrate. To obtain the desired columnar grain structure, the ceramic layer is preferably deposited by a PVD technique, and preferably an EBPVD technique.

TBC systems with the ceramic layer of this invention have been surprisingly shown to exhibit superior spallation resistance when compared to conventional YSZ coatings containing six weight percent yttria or more. Importantly, prior art ceramic layer materials for TBC systems have avoided zirconia stabilized by less than six weight percent yttria because such materials undergo a phase transformation that promotes spallation of the ceramic layer. However, in accordance with this invention, YSZ containing yttria levels below six weight percent have been determined to exhibit superior spallation resistance if the ceramic layer is appropriately deposited by EBPVD.

Other objects and advantages of this invention will be better appreciated from the following detailed description.

DETAILED DESCRIPTION OF THE INVENTION

The present invention is generally applicable to components that are protected from a thermally and chemically hostile environment by a thermal barrier coating system. Notable examples of such components include the high and low pressure turbine nozzles and blades, shrouds, combustor liners and augmentor hardware of gas turbine engines. While the advantages of this invention are particularly applicable to gas turbine engine components, the teachings of this invention are generally applicable to any component on which a coating may be used to thermally insulate the component from its environment.

Figure 1:
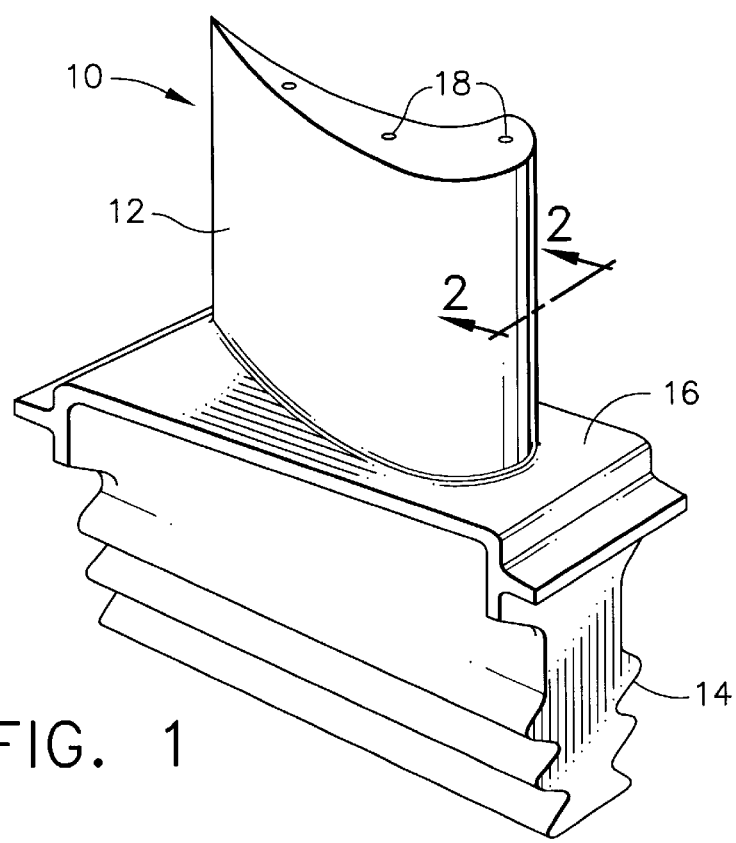
FIG. 1 is a perspective view of a high pressure turbine blade.

An example of a high pressure turbine blade 10 is shown in FIG. 1. The blade 10 generally has an airfoil 12 and platform 16 against which hot combustion gases are directed during operation of the gas turbine engine, and whose surfaces are therefore subjected to severe attack by oxidation, corrosion and erosion. The airfoil 12 is anchored to a turbine disk (not shown) with a dovetail 14 formed on a root section of the blade 10. Cooling holes 18 are present in the airfoil 12 through which bleed air is forced to transfer heat from the blade 10.

Figure 2:
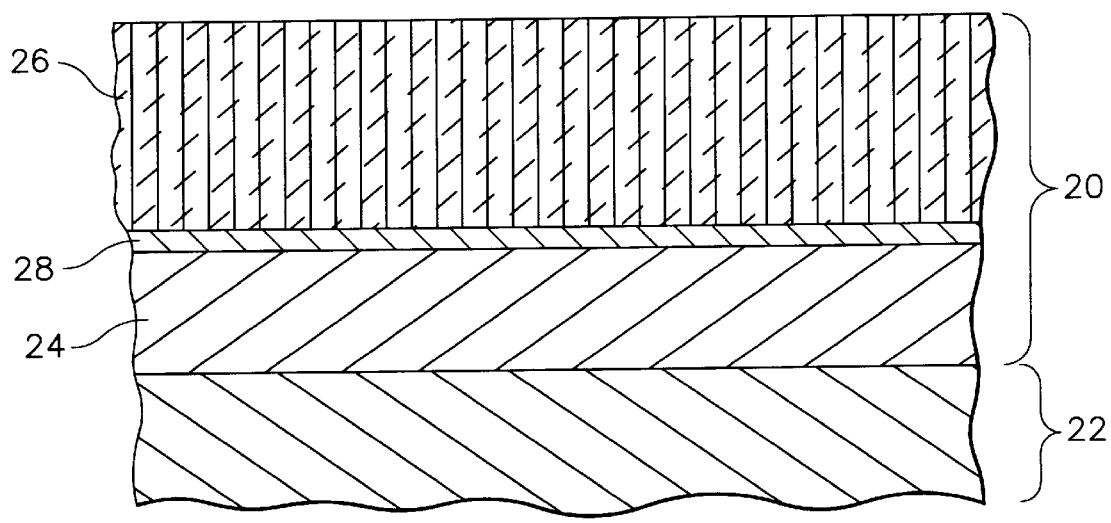
FIG. 2 is a cross-sectional view of the blade of FIG. 1 along line 2—2, and shows a thermal barrier coating system comprising a ceramic layer in accordance with this invention.

Represented in FIG. 2 is a thermal barrier coating system 20 in accordance with this invention. As shown, the coating system 20 includes a thermal-insulating ceramic layer 26 on a bond coat 24 that overlies a substrate 22, the latter of which is typically the base material of the blade 10. Suitable materials for the substrate 22 (and therefore the blade 10) include nickel and cobalt-base superalloys, though it is foreseeable that other materials could be used. As is typical with thermal barrier coating systems for components of gas turbine engines, the bond coat 24 is an aluminum-rich material, such as a diffusion aluminide or an MCrAlY or NiAl coating. These bond coat compositions are oxidation-resistant and form an alumina ($Al_2O_3$) layer or scale 28 on their surfaces during exposure to elevated temperatures. The alumina scale 28 protects the underlying superalloy substrate 22 from oxidation and provides a surface to which the ceramic layer 26 tenaciously adheres.

According to this invention, the material for the ceramic layer 26 is zirconia partially stabilized with less than six weight percent yttria, with a suitable range being about one up to six weight percent yttria, a more preferred range being about two to about five weight percent yttria. In addition, the ceramic layer 26 is characterized by a strain-tolerant columnar grain structure, as represented in FIG. 2. The columnar grain structure is attained by depositing the ceramic layer 26 on the bond coat 24 using a physical vapor deposition technique, and preferably EBPVD. According to this invention, deposition of the ceramic layer 16 by other known processes, such as air plasma spraying (APS) and low pressure plasma spraying (LPPS), yields unacceptable results, e.g., a TBC prone to spallation.

Figure 3:
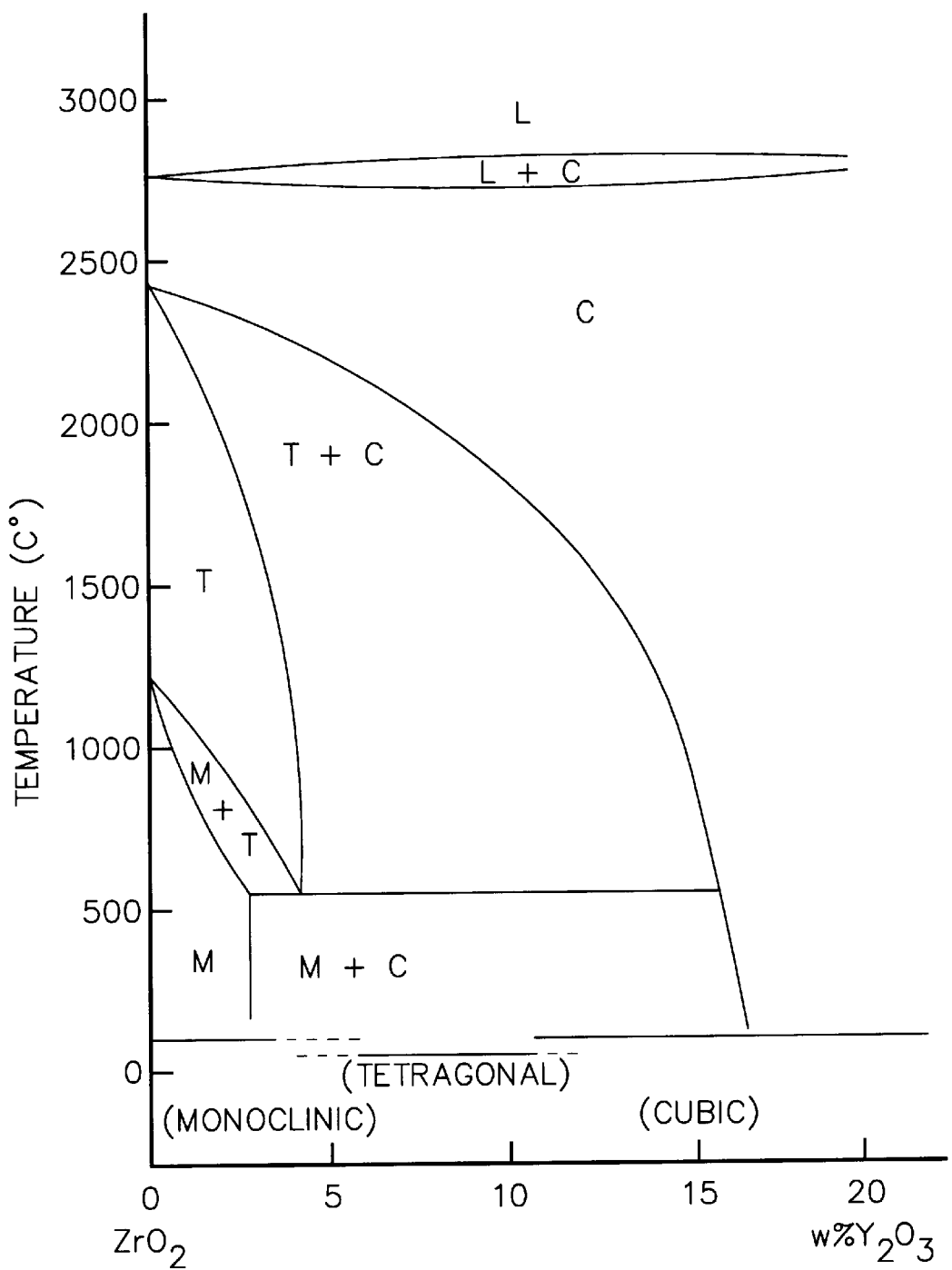
FIG. 3 is a phase diagram of the zirconia-rich region of the zirconia-yttria system.

In view of the above, it can be appreciated that the ceramic layer 26 of this invention is contrary to the prior art, in that the ceramic layer 26 contains less than the industry-accepted level of yttria for stabilization. Specifically, prior art YSZ coatings have required sufficient levels (at least six weight percent) of yttria to avoid the undesirable monoclinic phase, and have typically limited the yttria content to about six to eight weight percent in order to maintain a fully tetragonal phase. As evidenced by the zirconia-yttria phase diagram of FIG. 3, an yttria content of less than six weight percent causes the YSZ coating to undergo a tetragonal-to-monoclinic phase transformation during cooling. Such a phase transformation causes a volume expansion in the YSZ layer, promoting spallation. However, the YSZ ceramic layer 26 of this invention intentionally employs yttria levels below six weight percent, and therefore contains the undesirable monoclinic phase in an otherwise tetragonal matrix.

Surprisingly, the TBC coating system 20 employing the ceramic layer 26 of this invention has been shown to exhibit superior spallation resistance when compared to conventional YSZ coatings containing six weight percent yttria or more. The basis for the unexpected superior performance of the low-yttria YSZ ceramic layer 26 of this invention is not fully understood. While not wishing to be held to any particular theory, the improved performance may be related to the different failure mechanisms between PVD and plasma sprayed ceramic. TBC systems with plasma sprayed ceramic tend to spall by fracture within the ceramic layer, while TBC systems with PVD ceramic typically fracture within the thermally-grown aluminum oxide layer between the ceramic layer and bond coat.

In the course of evaluating this invention, furnace cycle tests were performed on nickel-base superalloy specimens having a zirconia layer stabilized by either four weight percent yttria (4%YSZ) or seven weight percent yttria (7%YSZ), the latter being representative of the industry standard YSZ coating material. The nickel-base superalloy was René N5, having the following nominal composition in weight percent: 7.5 cobalt, 7.0 chromium, 1.5 molybdenum, 5.0 tungsten, 3.0 rhenium, 6.5 tantalum, 6.2 aluminum, 0.15 hafnium, 0.05 carbon, 0.004 boron, with the balance nickel and incidental impurities. The YSZ layers were deposited by EBPVD to a thickness of about 0.005 inch (about 125 micrometers) on platinum aluminide bond coats. Both YSZ coatings were characterized by a columnar grain structure as a result of the EBPVD deposition process. However, while the 7%YSZ coating was characterized by a fully tetragonal phase, the 4%YSZ coating of this invention was characterized by up to about 10 volume percent of the monoclinic phase in a tetragonal matrix.

The test was conducted at a temperature of about 2075° F. (about 1135° C.), and continued until fracture or spallation of the YSZ coating occurred. The 4%YSZ specimens of this invention exhibited an average life of about 1000 cycles, as compared to 555 cycles for the standard 7%YSZ specimens. A second series of furnace cycle tests was performed under the same conditions as before, with the exception that a marginally different platinum aluminide bond coat was used. Again, the 4%YSZ specimens of this invention exhibited a superior cycle fatigue life, with an average life of about 700 cycles as compared to 538 cycles for the standard 7%YSZ specimens.

From these tests, it was determined that an EBPVD 4%YSZ ceramic layer (i.e., a YSZ coating characterized by a columnar grain structure with a monoclinic phase in a tetragonal matrix) exhibited superior adhesion over conventional 7%YSZ coatings under harsh thermal conditions. Such a result is completely contrary to prior art teachings and tests which have shown 6–8%YSZ coatings to be superior. On the basis of these tests, it is believed that a PVD YSZ stabilized by less than six weight percent yttria exhibits greater adhesion at temperatures above about 2000° F. (about 1100° C.) than does PVD YSZ stabilized with greater than six weight percent yttria. It is further believed that the hardness, and therefore the erosion and impact resistance, of the low-yttria PVD YSZ coating of this invention is superior to prior art YSZ coatings containing 7% or more yttria.

Also from the above tests, it is believed that PVD YSZ stabled by less than six weight percent yttria can be advantageously used as a base layer for other ceramic layers. For example, 20%YSZ is extremely stable at elevated temperatures but exhibits inferior adhesion as compared to conventional 6–8%YSZ. According to this invention, using a <6%YSZ layer as a base on which a YSZ layer stabilized by >17% yttria is deposited would yield a thermal barrier coating characterized by enhanced adhesion as a result of the low-yttria YSZ base layer and increased thermal stability as a result of the high-yttria YSZ layer at the surface of the TBC system. Alternatively, the composition of a ceramic layer could be graded to have an yttria content of less than six weight percent adjacent the bond coat and greater than eight weight percent, e.g., greater than seventeen weight percent, at the outer surface of the ceramic layer.

While the invention has been described in terms of a preferred embodiment, it is apparent that other forms could be adopted by one skilled in the art. For example, MCrAlY and NiAl bond coats could be used, and the thickness of the ceramic layer could vary from that tested. Furthermore, while YSZ coatings in accordance with this invention are particularly advantageous for use at temperatures above 2000° F., lower temperature applications can also benefit from the enhanced adhesion provided by such ceramic compositions. Therefore, the scope of the invention is to be limited only by the following claims.

What is claimed is:

1. A thermal barrier coating system on a component of a gas turbine engine, the thermal barrier coating system comprising a PVD thermal insulating layer consisting of zirconia partially stabilized by about 1 to less than 6% yttria, the ceramic layer being characterized by a columnar grain structure in which a monoclinic phase is present at room temperature.

2. A thermal barrier coating system as recited in claim 1, wherein the monoclinic phase is present in a tetragonal matrix.

3. A thermal barrier coating system as recited in claim 1, wherein the thermal insulating layer contains about 2 to about 5 weight percent yttria.

4. A thermal barrier coating system as recited in claim 1, wherein the thermal insulating layer has an yttria content of less than 6 weight percent at an innermost region of the thermal insulating layer and an yttria content of greater than 6 weight percent at an outer surface of the thermal insulating layer.

5. A thermal barrier coating system as recited in claim 1, wherein the thermal insulating layer has a graded yttria content characterized by an yttria content of less than 6 weight percent at an innermost region of the thermal insulating layer and an yttria content of greater than 6 weight percent at an outer surface of the thermal insulating layer.

6. A thermal barrier coating system as recited in claim 1, further comprising a bond coat adhering the thermal insulating layer to the component.

7. A thermal barrier coating system as recited in claim 1, wherein the component is a superalloy component of a gas turbine engine.

8. A thermal barrier coating system as recited in claim 1, wherein the thermal insulating layer is an EBPVD ceramic layer.

9. A thermal barrier coating system on a component of a gas turbine engine, the thermal barrier coating system comprising:

a thermal insulating layer of zirconia partially stabilized by 1 weight percent up to less than 6 weight percent yttria so as to contain both monoclinic and tetragonal phases, the thermal insulating layer being deposited by PVD and having a columnar grain structure; and a bond coat adhering the thermal insulating layer to the substrate.

10. A thermal barrier coating system as recited in claim 9, wherein the thermal insulating layer contains about 2 to about 5 weight percent yttria.

11. A thermal barrier coating system as recited in claim 9, wherein the thermal insulating layer contains about 4 weight percent yttria.

12. A thermal barrier coating system as recited in claim 9, wherein the thermal insulating layer has an yttria content of less than 6 weight percent adjacent the bond coat and an yttria content of greater than 17 weight percent at an outer surface of the thermal insulating layer.

13. A thermal barrier coating system as recited in claim 9, wherein the thermal insulating layer has a graded yttria content characterized by an yttria content of less than 6 weight percent adjacent the bond coat and an yttria content of greater than 17 weight percent at an outer surface of the thermal insulating layer.

14. A thermal barrier coating system as recited in claim 9, wherein the bond coat is formed of a material chosen from the group consisting of diffusion aluminides, MCrAlY and NiAl.

15. A thermal barrier coating system as recited in claim 9, wherein the component is a superalloy component.

16. A thermal barrier coating system on a superalloy component of a gas turbine engine, the thermal barrier coating system comprising:

a platinum aluminide bond coat on the substrate; and an EBPVD thermal-insulating ceramic layer on the bond coat, the ceramic layer consisting essentially of zirconia partially stabilized by about 2 to about 5 weight percent yttria, the ceramic layer being characterized by a columnar grain structure and a monoclinic phase in a tetragonal matrix.

17. A thermal barrier coating system as recited in claim 16, wherein the superalloy component is a blade of a gas turbine engine.

18. A thermal barrier coating system as recited in claim 16, wherein the ceramic layer contains about 4 weight percent yttria.

19. A thermal barrier coating system as recited in claim 16, wherein the ceramic layer has an yttria content of about 2 to about 5 weight percent adjacent the bond coat and an yttria content of greater than 17 weight percent at an outer surface of the ceramic layer.

20. A thermal barrier coating system as recited in claim 16, wherein the ceramic layer has a graded yttria content characterized by an yttria content of about 2 to about 5 weight percent adjacent the bond coat and an yttria content of greater than about 17 weight percent at an outer surface of the ceramic layer.

* * * * *